United States Patent [19]
Chittipeddi et al.

[11] Patent Number: 5,773,867
[45] Date of Patent: Jun. 30, 1998

[54] PROGRAMMABLE HEX-ROM WITH ISOLATION TRANSISTOR STRUCTURE

[75] Inventors: Sailesh Chittipeddi, Emmaus, Pa.; William Thomas Cochran, Clermont, Fla.; Kang Woo Lee, Allentown, Pa.

[73] Assignee: Lucent Technologies, Inc., Murray Hill, N.J.

[21] Appl. No.: 827,352

[22] Filed: Mar. 26, 1997

Related U.S. Application Data

[63] Continuation of Ser. No. 428,264, Apr. 25, 1995, abandoned.

[51] Int. Cl.[6] .......................... H01L 29/78; G11C 17/00
[52] U.S. Cl. ....................... 257/390; 365/104; 257/401; 257/394
[58] Field of Search .................................... 257/390, 394, 257/401; 365/104

[56] References Cited

U.S. PATENT DOCUMENTS

| | | |
|---|---|---|
| 4,193,125 | 3/1980 | Yoshiaki . |
| 5,245,212 | 9/1993 | Gill ......................................... 257/390 |
| 5,422,844 | 6/1995 | Wolstenholme ........................ 365/104 |

OTHER PUBLICATIONS

Patent Abstracts of Japan, vol. 8, No. 217 (E–270), 4 Oct. 1984 and JP–A–59 103352 (Oki Denki Kogyo KK), 14 Jun. 1984. Abstract Only.
Patent Abstract of Japan vol. 9, No. 110 (E–314), 15 May 1985 and JP–A–60 001863 (Nippon Denki KK), 8 Jan. 1985. Abstract Only.
Semiconductor Memories, Betty Prince, Texas Instruments, USA, pp. 512–513.
The Design and Analysis of VLSI Circuits, Lance A. Glasser and Daniel W. Dobberpuhl pp. 382–383.
Novel Circuits for High Speed ROM's Tegze P. Haraszti, Member, IEEE, 1984.
A 65 mW 128K EG–ROM, Kazuhide Kiuchi, Nobuaki Ieda, Ken Takeya, and Tatsuo Babo, IEEE 1979.
A 256 kbit ROM with Serial ROM Cell Structure, Roger Cuppens and L. H. M. Sevat, IEEE 1983.

*Primary Examiner*—Jerome Jackson

[57] ABSTRACT

A ROM (read only memory) is disclosed. For via-ROMs, an isolation transistor is used to isolate adjacent pairs of memory devices instead of the more conventional field oxide isolation. The gate of the isolation transistor is grounded, insuring that conduction does not take place. For a GASAD ROM, a field oxide isolation is used.

1 Claim, 6 Drawing Sheets

PROGRAMMABLE HEX-ROM WITH ISOLATION TRANSISTOR STRUCTURE

This is Continuation of application Ser. No. 08/428,264 filed Apr. 25, 1995, now abandoned.

TECHNICAL FIELD

This invention relates to integrated circuits and methods for their formation.

BACKGROUND OF THE INVENTION

Read only memories (ROMs) are sometimes formed according to the design depicted in FIG. 1, which is a top-down view of a partially fabricated integrated circuit. The ROM depicted in FIG. 1 is sometimes termed a "Via ROM" In FIG. 1 reference numeral 11 denotes a field oxide region. Reference numeral 13 denotes a thin-oxide or "thinox" region. Typically, region 13 is covered by an oxide of silicon, usually thermally grown, having a thickness between 30 Å and 500 Å. Buried, doped conductive region 15 is ultimately connected to ground, sometimes termed "$V_{ss}$." Horizontal polysilicon stripes 17 and 19 cover portions of thinox region 13 and also extend over field oxide 11. Metal-filled conductor openings 19 are ultimately connected to a high voltage supply, usually termed $V_{dd}$. Thus, polysilicon stripes 17 may be viewed as the gates of two transistors which have a common grounded source/drain. Both transistors conduct when contact openings 19 are connected to $V_{dd}$ Should a contact opening 19 be left unconnected to $V_{dd}$, its associated transistor will not conduct current. Thus, each transistor may represent either a "one" or "zero" depending upon whether it is capable of conducting current or not. A second pair of transistors is formed over thinox region 131. Buried conductor 151 is connected to $V_{ss}$. Polysilicon stripes 171 traverse portions of thinox region 131 and field oxide 11. Metal-filled contacts 191 are ultimately connected to $V_{dd}$. Should one of contacts 191 be unconnected to $V_{dd}$, its associated transistor will not conduct. Transistor pair 21 is separated from transistor pair 211 by field oxide 11. The width of field oxide 11 between transistor pairs 21 and 211 is $d_1$. As mentioned before, the ROMs depicted in FIG. 1 are termed "via ROMs" because the presence or absence of metal-filled vias which are connected to contacts such as contacts 19 and 191 determines whether a "one" or a "zero" is stored. Another type of ROM (not depicted in FIG. 1) is termed a "diffusion ROM" or a "GASAD ROM" The "diffusion ROM" or "GASAD ROM" may store a "one" or a "zero" depending upon whether there exists a thinox region adjacent a gate, such as gates 17, 19, and 171. ("GASAD" is an acronym for gate and source and drain.) Thus, GASAD ROMs are programmed at the thinox level in the fabrication sequence. Via ROMs are generally programmed at the metal 2 level, or possibly the metal 1 level.

Another read only memory, sometimes termed a "Hex-ROM" is depicted in FIG. 6. The device of FIG. 6 is a "diffusion ROM" or "GASAD ROM". In FIG. 6 the field oxide region is denoted by reference numeral 511. Two sets of cells are depicted in the figure. In the bottom set of cells the gates have been removed so that an unobstructed view of the shape of the thinox region may be obtained. However, in actual use, the bottom set of cells contains a pair of gates similar to the gates in the top set of cells. Examining the bottom set of cells first, it will be noted that thinox region 513 contains a central section 5151 which is ultimately connected to $V_{ss}$. Contact opening 5191 overlies region 5151. Four additional contact openings 5201, 5231, 5221, and 5211 are symmetrically placed around contact opening 5191. Each of the contact openings 5201, 5231, 5221, and 5211 may or may not be connected by a portion of thinox region 513 to contact opening 5191. In the example of FIG. 6, it will be noted that contact opening 5221 is not connected by a thinox region to opening 5191. Thus, if a gate were formed between contacts 5191 and 5221, the structure would be incapable of transistor operation. However, if a gate were formed between contact 5231 and 5191, transistor operation would be feasible since there exists a thinox region connecting both contacts.

In the upper portion of FIG. 6, thinox opening 515 which is connected to $V_{ss}$, is surrounded by contacts 520, 5201, 5231, and 523. Polysilicon stripes 517 and 518 are positioned over thinox region 513. Examination of the upper portion of FIG. 6 indicates that four transistors are defined by polysilicon gates 517 and 518. Specifically, polysilicon gate 517 defines a transistor between contacts 515 and 523 and also defines a transistor between contacts 515 and 520. Polysilicon stripe 518 defines a transistor between contacts 515 and 5231 and, also defines a transistor between contacts 515 and 5201. As mentioned before, similar polysilicon stripes are assumed present in the lower portion of FIG. 6, but they have been omitted for reasons of clarity. Because of the absence of thinox region between contacts 5191 and 5221, no transistor is formed between these contacts. Thus, the structure in the bottom portion of FIG. 6 forms only three transistors when polysilicon stripes similar to those depicted in the upper portion FIG. 6 are formed in the lower portion of FIG. 6. It will be noted that the thinox region 513 is continuous between the upper set of transistors 611 and the lower set of transistors 612.

Those concerned with the development of integrated circuits have consistently sought methods and designs for reducing the size of cell arrays and improving performance.

SUMMARY OF THE INVENTION

Illustratively, the present invention includes two memory devices separated from each other by an isolation transistor. The isolation transistor is incapable of conduction and thereby, isolates the two memory devices.

In another embodiment, the invention includes a via programmable Hex-ROM having a first group of four transistors having a common, central grounded first junction. Each transistor of the first group has a separate second junction. Two transistors of the first group have a first common gate and a second pair of transistors of the first group have a second common gate. A second group of four transistors is separated from the first group of transistors by a field oxide. Each transistor of the second group has a common central grounded first junction. Each transistor of the second group has a separate second junction. One pair of transistors of the second group has a first common gate and a second pair has a second com on gate.

DETAILED DESCRIPTION

Figure 1:
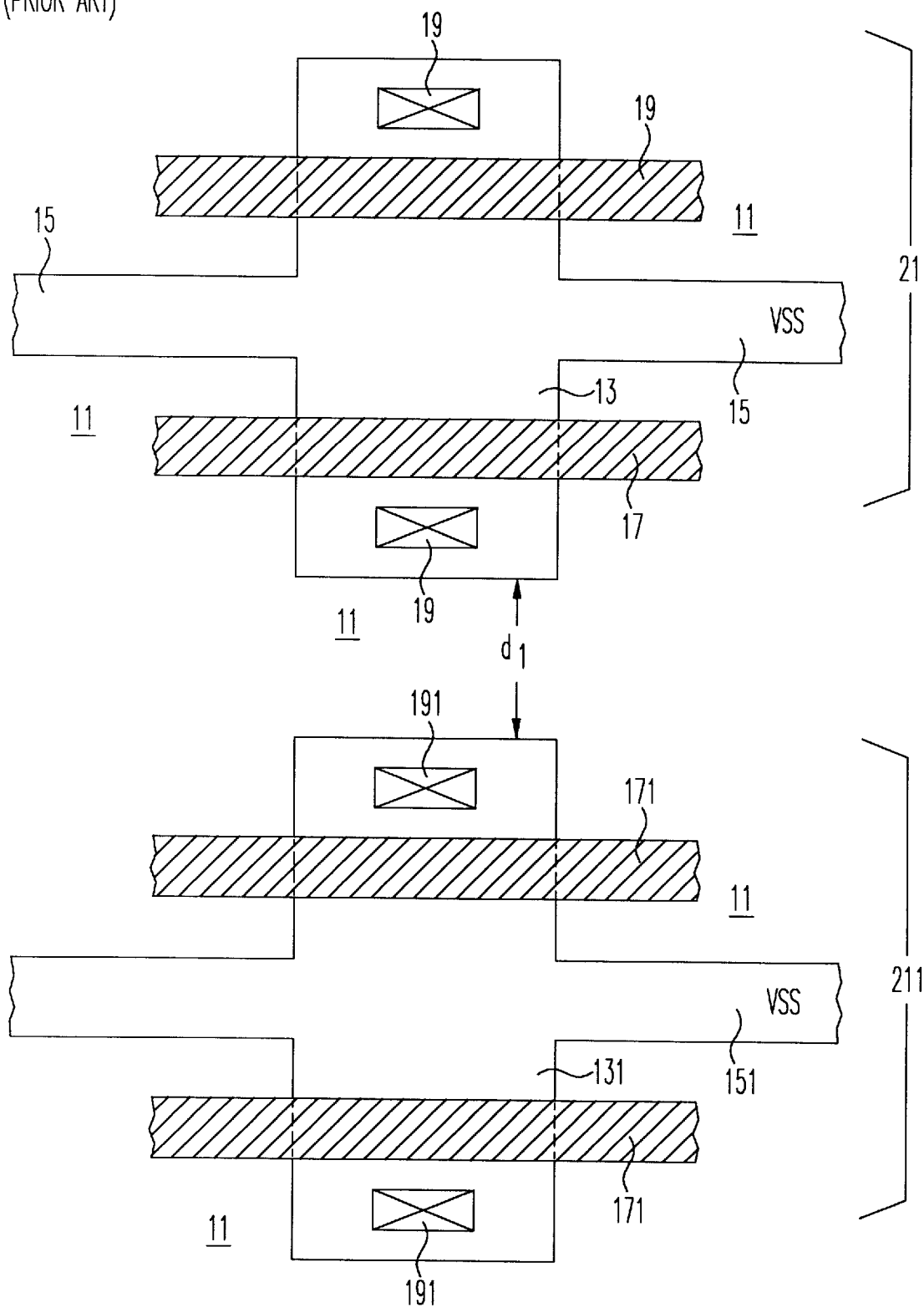
FIGS. 1, 2, 4, 5 and 6 are plan views of partially fabricated integrated circuits.
Figure 2:
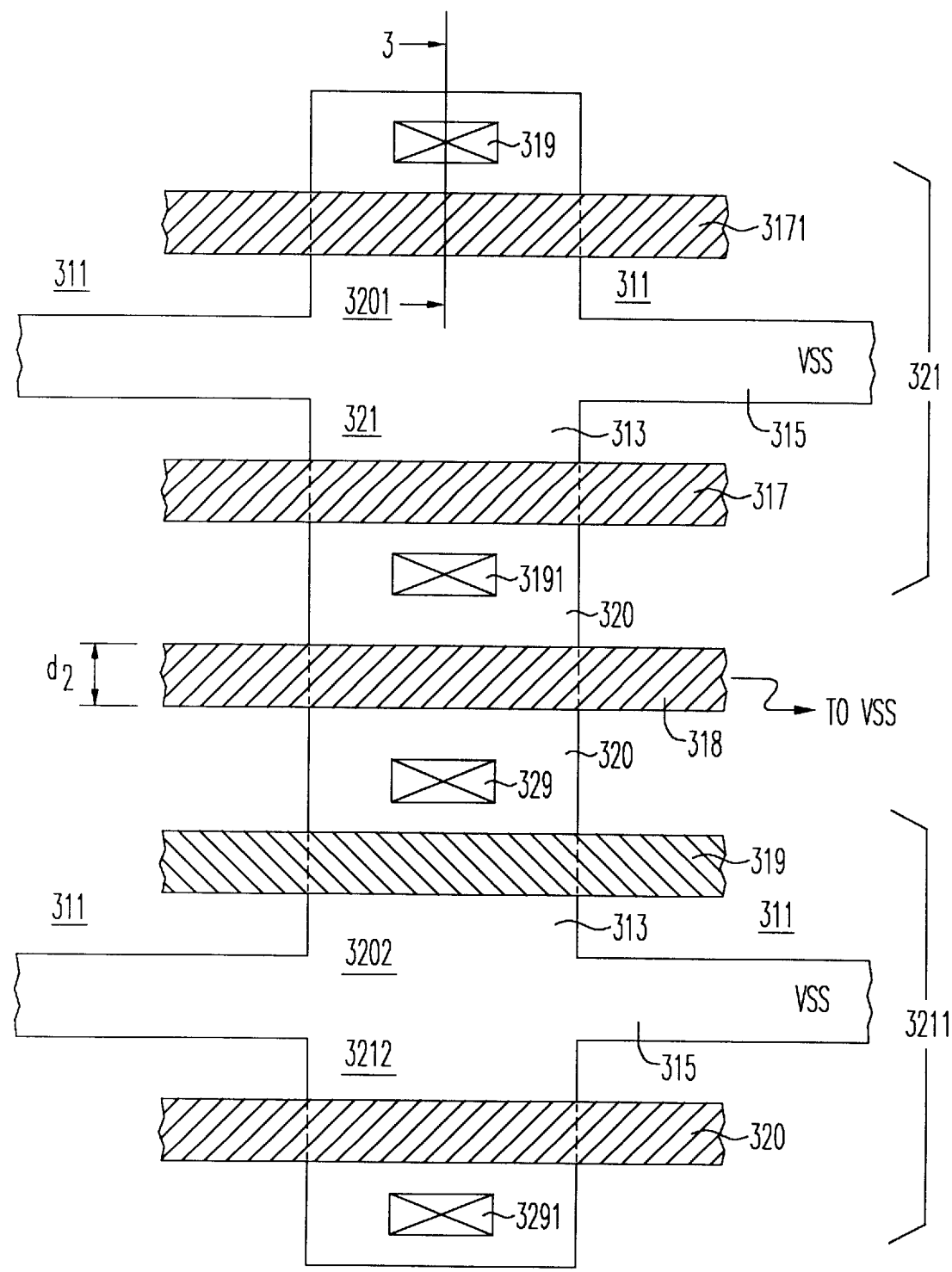

FIG. 2 shows an illustrative embodiment of the present invention. Briefly, a comparison of FIG. 2 and FIG. 1 shows that field oxide 11 has been eliminated between device pair 211 and device pair 21. Field oxide 11 has been replaced by a continuous thinox region 320 which is covered by polysilicon stripe 318. Polysilicon stripe 318 is grounded, that is connected, to $V_{ss}$. Thus, the field oxide 11 separating transistor pairs 21 and 211 in FIG. 1 has been replaced by a normally-off transistor. However, the window-gate spacing 3191/329 to 318 is considerably less than the width, of $d_1$, of field oxide 11 in FIG. 1. Thus, a space saving has been realized. Transistor pairs 321 and 3211 (FIG. 2) may be positioned more closely than transistor pairs 21 and 211 (FIG. 1) because $d_2$ is less than $d_1$, i.e. because window 318 can be made more narrow than corresponding field oxide 11. Examining FIG. 2 in more detail, reference numeral 311 denotes a field oxide. Reference numeral 313 denotes a thinox region which is continuous between two or more groups of cells, e.g. 321 and 3211. Reference numeral 315 denotes that a portion of thinox region 313 which overlies a buried conductor connected to the $V_{ss}$. Polysilicon stripe 3171 is the gate of a transistor. The source associated with gate 3171 is denoted by reference numeral 319. The drain associated with gate 3171 is integrally connected with buried conductor 315 and denoted by reference numeral 3201. Source 3191 is associated with gate 317. The drain associated with gate 317 is denoted with reference numeral 321 and integrally connected to $V_{ss}$. Gates 317 and 3171 define two transistors which comprise transistor pair 321. Similarly, transistor pair 3211 is defined by gates 319 and 320 with associated sources 329 and 3291 respectfully. Drain regions 3202 and 3212 are integrally connected to $V_{ss}$. As mentioned before, comparison of FIG. 2 with FIG. 1 shows that there is no field oxide separating transistor pair 321 from transistor pair 3211. In other words, thinox region 313 is continuous for both pairs 321 and 3211. Polysilicon gate 318 having a length $d_2$ traverses thinox region 313. Polysilicon gate 318 is connected to $V_{ss}$ and, is therefore, incapable of conduction. Thus, the non-conducting transistor defined by gate 318 and thinox region 313 serves to effectively isolate transistor pair 321 from transistor pair 3211.

The pattern of the FIG. 2 may be repeated in a vertical direction as many times as desired. Since window-gt $d_2$ is smaller than $d_1$, a space savings occurs with every repetition of the pattern. Fabrication of the structure shown in FIG. 2 may be accomplished by defining thinox region 313 and field oxide 311 by a process such as the LOCOS process. Then gates 3171, 317, 319 and 320 are formed. Then an ion implantation step is performed to dope the exposed regions of thinox 313 (i.e. to create source and drain regions which are not covered by gates) and also thereby create buried conductors such as conductor 315.

Figure 3:
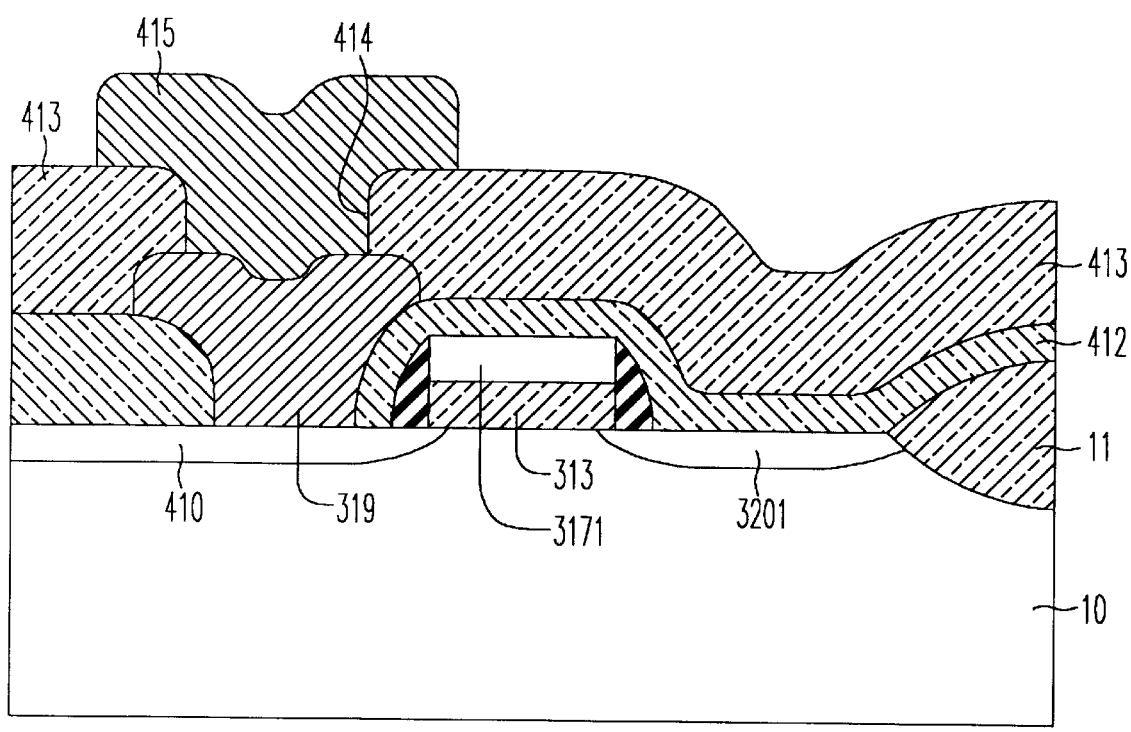
FIG. 3 is a cross-sectional view of partially fabricated integrated circuit useful in understanding an illustrative embodiment of the present invention.

It will be noted that contact openings 319, 3191, 329, and 3291 are filled with "X"'s thereby indicating that they are filled with metal. Of course, not all transistors have a source connected to $V_{dd}$. FIG. 3, a cross-sectional view of a portion of FIG. 2, illustrates the manner in which a connection to $V_{dd}$ may be accomplished. In FIG. 3, field oxide is denoted by reference numeral 11. Gate oxide is denoted by reference numeral 313. Source and drain regions are denoted by reference numerals 410 and 3201 respectfully. Reference numeral 412 denotes a dielectric layer which covers drain 3201 and which has been opened to expose source 410. Metallization 319 is formed in the window which exposes source 410. A second level of dielectric 413 covers dielectric 412 and optional opening 414 may be made in dielectric 413. Opening 414 may be filled with patterned conductor 415 if a connection to $V_{dd}$ is desired. If a connection to $V_{dd}$ is not desired, opening 414 is not created in dielectric 413 and therefore, conductor 319 is not connected to $V_{dd}$. It is generally preferable to make connection to $V_{dd}$ at a high level of an integrated circuit, for example, using a second-level metal 415 because product fabrication is made faster.

Figure 4:
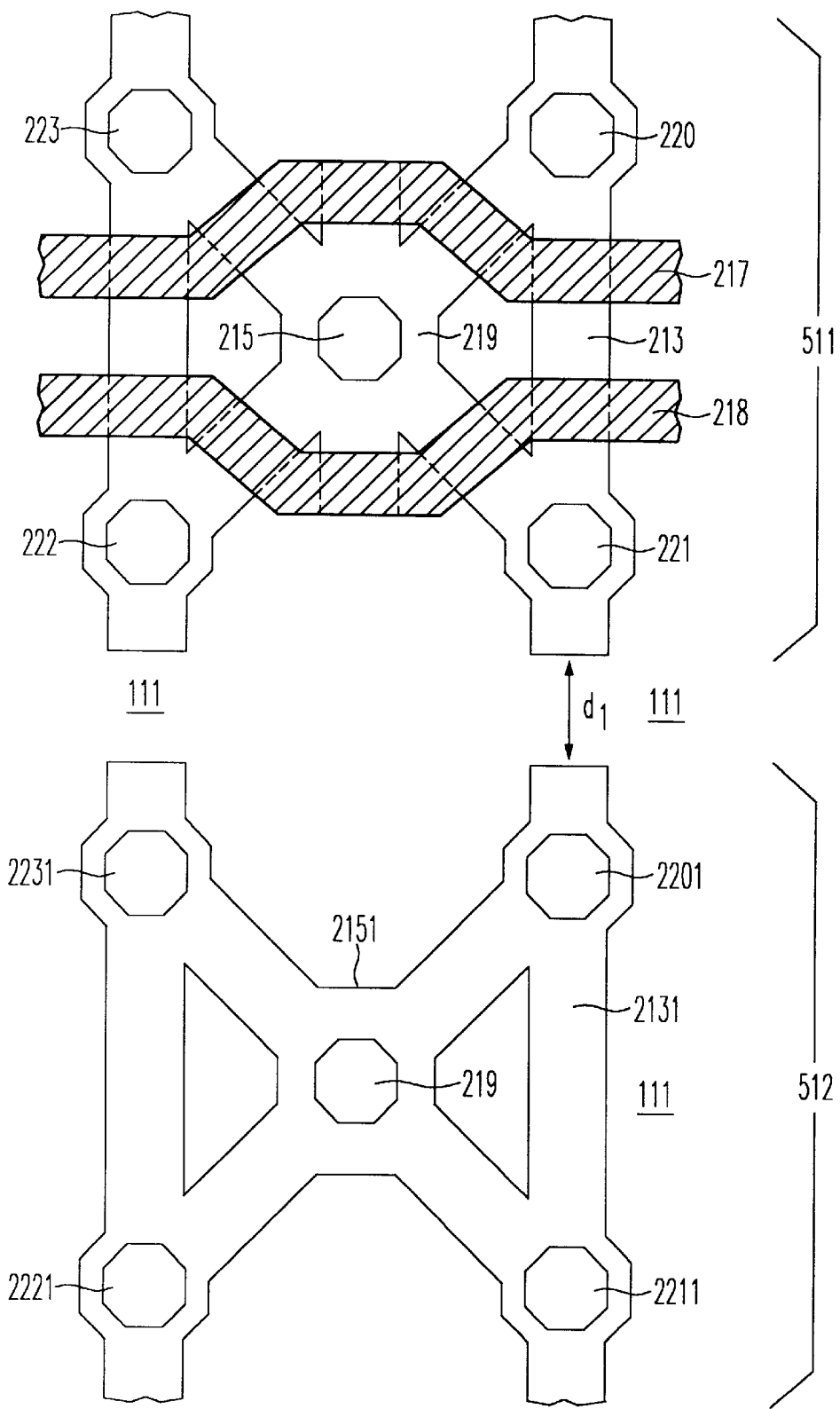

An improved Hex-ROM (of the Via-ROM type) is depicted in FIG. 4. In FIG. 4, a field oxide region is denoted by reference numeral 111. Two sets of cells are depicted in the figure. In the bottom set of cells, the gates have been removed so that an unobstructed view of the shape of the thinox region may be obtained. However, in actual use, the bottom set of cells contains a pair of gates similar to the top set of cells. Examining the bottom set of cells first, it will be noted that thinox region 2131 contains a section 2151 which is ultimately connected to $V_{ss}$. Contact opening 2191 lies over region 2151. Four additional contact openings 2201, 2211, 2221 and 2231 are symmetrically placed around contact open 2191. Each of the contact openings 2201, 2211, 2221 and 2231 is connected by a portion of thinox region 2131 to opening 2191.

An examination of the upper portion of FIG. 4 illustrates how an appropriately-shaped pair of polysilicon gates may be utilized to form four transistors over thinox regions similar to that depicted in the lower portion of FIG. 4. In the upper portion of FIG. 4, thinox opening 219 and Vss contact 215 are surrounded by openings 220, 221, 222, and 223. Polysilicon stripes 217 and 218 are positioned over thinox region 213. Examination of the upper portion of FIG. 4 indicates that four transistors are defined by the polysilicon gates 217 and 218. Specifically, polysilicon gate 217 defines a transistor between contacts 219 and 223 and also defines a transistor between contacts 219 and 220. Polysilicon stripe 218 defines a transistor between contacts 219 and 222 and, also defines transistor between contacts 219 and 221. As mentioned before, similar polysilicon stripes are present in the lower portion of FIG. 4 but they have been omitted for reasons of clarity. The upper four transistor cell of FIG. 4 is separated from the lower four transistor cell of FIG.4 by field oxide 111 which has a thickness denoted by $d_1$.

The transistors in the upper in FIG. 4 may be rendered conductive by the presence or absence of electrical contacts between openings 220, 221, 222, and 223 and $V_{dd}$. Thus, the presence, or absence, of metallization indicates either a one or zero. As mentioned before, the ROM described in FIG. 4 is often termed a "Hex-ROM" (because of the somewhat hexagonal shape of gates 217 and 218). It has the advantage over prior art methods of being programmable at the via level in addition to the GASAD level, at faster speeds and lower power consumption.

Figure 5:
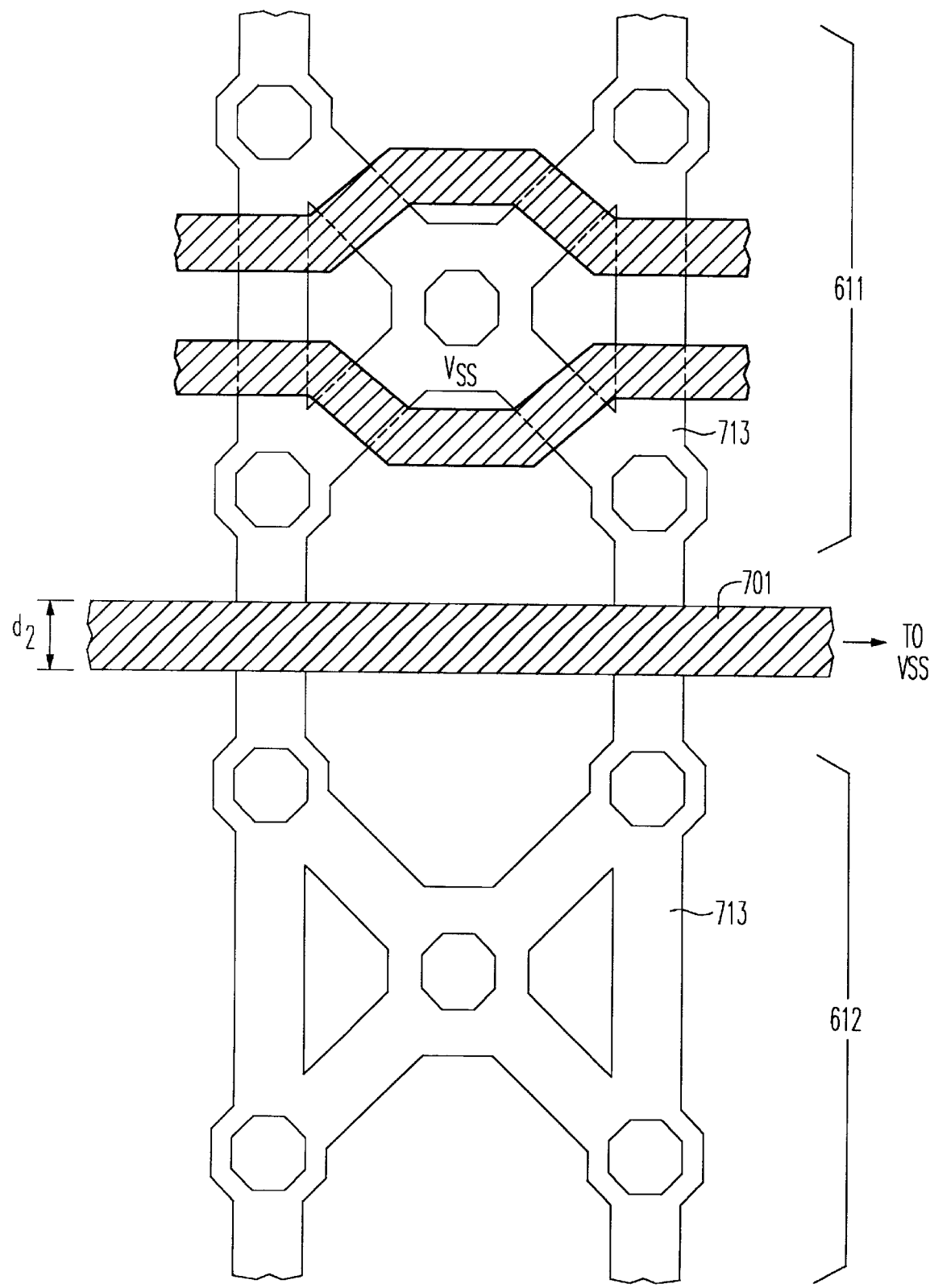
Figure 6:
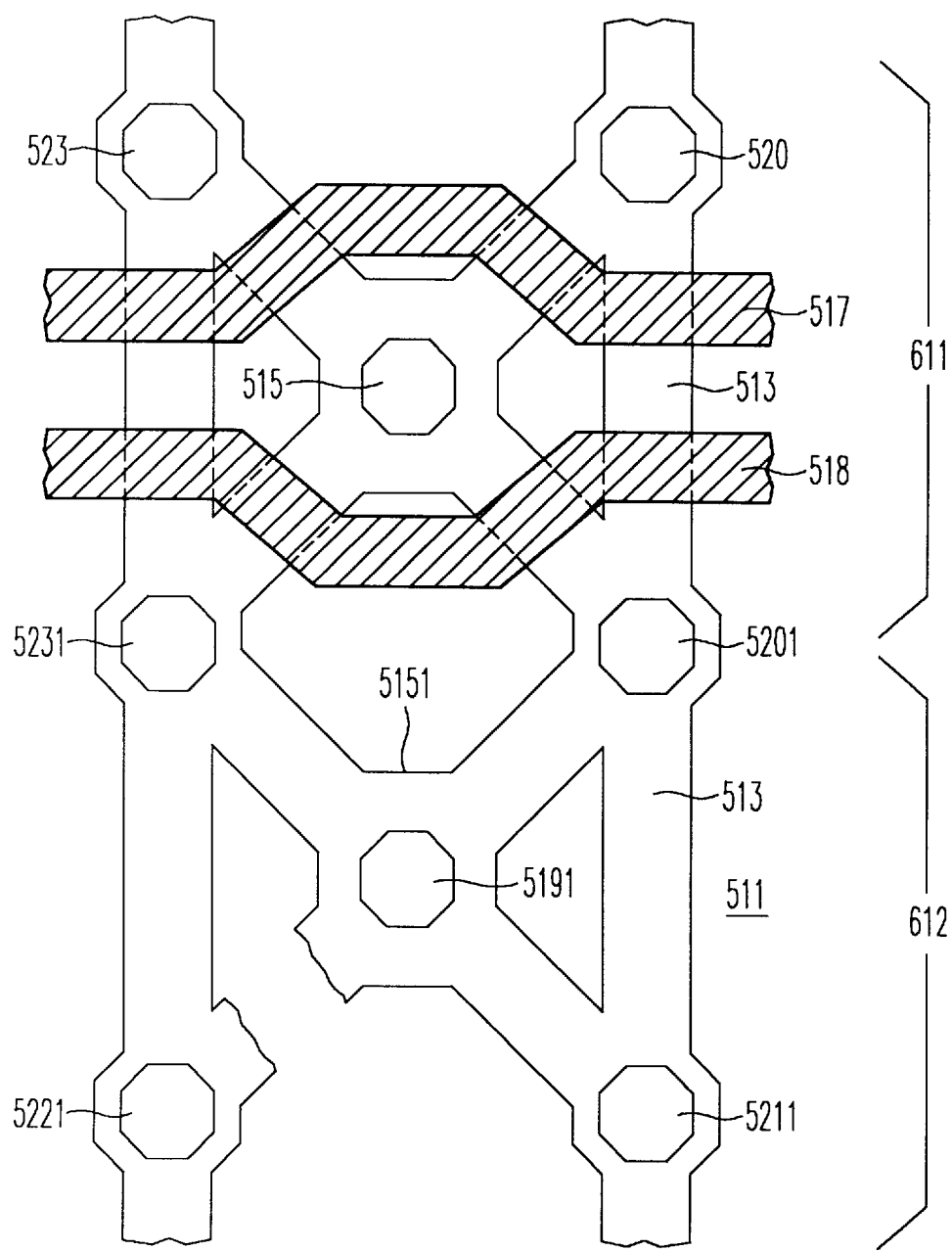

Examination of FIG. 4, illustrates that transistor set 511 is separated from transistor set 512 by field oxide 111 which has dimension of $d_1$. In the embodiment of FIG. 5, it will be noted that corresponding transistor set 611 is separated from transistor set 612 by gate 701. Thinox region 713 is continuous from cell set 611 to cell set 612. Isolation of cell set 611 from cell set 612 is accomplished by connecting polysilicon gate 701, which has dimension $d_2$, to $V_{ss}$. The pattern of FIG. 5, may be replicated any number of times in the vertical direction, thereby, substantially saving space. Similarly, the $V_{dd}$ connection is desirably made through a second-level metal as illustrated in FIG. 3.

The term "transistor" as used throughout means a device with gate and source and drain whether or not the gate and source and drain are connected to voltages which render the transistor capable of conduction.

The invention claimed is:

1. A programmable Hex-ROM, comprising:

a plurality of groups of four transistors, each of the groups of four transistors having a first plurality of junction points and a second plurality of junction points, the first junction points of each of the groups being connected to a common voltage relative to a substrate of the Hex-ROM;

a plurality of via holes, the via holes corresponding to a portion of the second junction points; and a plurality of isolation transistors, each of the isolation transistors being disposed between a pair of adjacent transistors of the groups of four transistors, a plurality of gates of the isolation transistors being set to a voltage relative to the substrate of the Hex-ROM so that the adjacent transistors are isolated from each other, wherein the Hex-ROM is programmed by selecting ones of the second junction points to be included in the portion of the second junction points.

* * * * *